US011538816B2

(12) United States Patent
Hung

(10) Patent No.: US 11,538,816 B2
(45) Date of Patent: Dec. 27, 2022

(54) INTEGRAL MULTIFUNCTION CHIP

(71) Applicant: AICP Technology Corporation, Miaoli County (TW)

(72) Inventor: Kei-Kang Hung, Hsinchu County (TW)

(73) Assignee: AICP TECHNOLOGY CORPORATION, Miaoli County (TW)

(*) Notice: Subject to any disclaimer, the term of this patent is extended or adjusted under 35 U.S.C. 154(b) by 0 days.

(21) Appl. No.: 17/351,954

(22) Filed: Jun. 18, 2021

(65) Prior Publication Data

US 2021/0313338 A1 Oct. 7, 2021

Related U.S. Application Data

(62) Division of application No. 16/749,740, filed on Jan. 22, 2020, now Pat. No. 11,257,828.

(30) Foreign Application Priority Data

Jan. 30, 2019 (TW) ................................ 108103558

(51) Int. Cl.
*H01L 27/112* (2006.01)
(52) U.S. Cl.
CPC ............................ *H01L 27/11206* (2013.01)

(58) Field of Classification Search
None
See application file for complete search history.

(56) References Cited

U.S. PATENT DOCUMENTS

| 2011/0110004 | A1 | 5/2011 | Maier |
| 2015/0003142 | A1 | 1/2015 | Chung |
| 2015/0187431 | A1 | 7/2015 | Chung |
| 2016/0301202 | A1 | 10/2016 | Tsukamoto et al. |

FOREIGN PATENT DOCUMENTS

CN  104081640 A  10/2014

*Primary Examiner* — Alexander G Ghyka
(74) *Attorney, Agent, or Firm* — Li & Cai Intellectual Property (USA) Office

(57) ABSTRACT

An integral multifunction chip is provided. The integral multifunction chip includes an electronic fuse and an interface fuse. The interface fuse and the electronic fuse are disposed in parallel and integrated in a single chip. In a case where only a single chip is provided, the integral multifunction chip of the present disclosure can be selectively operated in a working mode of the electronic fuse or the interface fuse, so that convenience of use of the integral multifunction chip can be improved.

4 Claims, 5 Drawing Sheets

INTEGRAL MULTIFUNCTION CHIP

CROSS-REFERENCE TO RELATED APPLICATION

This application is a divisional application of Ser. No. 16/749,740 filed on Jan. 22, 2020, and entitled "INTEGRAL MULTIFUNCTION CHIP", now pending, the entire disclosures of which are incorporated herein by reference.

FIELD OF THE DISCLOSURE

The present disclosure relates to an integral multifunction chip, and more particularly to an integral multifunction chip integrating an electronic fuse and an interface fuse.

BACKGROUND OF THE DISCLOSURE

An electronic fuse is a component that can modify the function of an integrated circuit that has left the factory. In other words, the function of the integrated circuit has been etched on the semiconductor wafer during the manufacturing process, and cannot be modified after the integrated circuit is produced. However, by a technology associated with the electronic fuse, the function of the integrated circuit can be adjusted while the integrated circuit is operating.

The electronic fuse can be used as a One Time Programming ROM (OTP ROM) by consuming a certain amount of power on the integrated circuit to cut off the electronic fuse, so that the function of the integrated circuit can be changed. However, the application of the electronic fuse in the integrated circuit requires high power to achieve the purpose of cutting off the electronic fuse so as to change the function of the integrated circuit, and operating power thereof is limited.

SUMMARY OF THE DISCLOSURE

In response to the above-referenced technical inadequacies, the present disclosure provides an integral multifunction chip, and the integral multifunction chip includes an electronic fuse and an interface fuse. The interface fuse is connected to the electronic fuse in parallel. The electronic fuse and the interface fuse are integrated within a single chip. A logic state of the integral multifunction chip is changed according to whether the electronic fuse is blown or a resistance value of the interface fuse is high or low.

In order to solve the aforementioned problem, the present disclose also provides an integral multifunction chip, and the integral multifunction chip includes an electronic fuse and an interface fuse. The interface fuse is connected to the electronic fuse in parallel. A relationship between voltage and current is positively or negatively correlated when the integral multifunction chip is operated in a working mode of the electronic fuse.

Therefore, one of the beneficial effects in the present disclosure is that the integral multifunctional chip provided in the present disclosure can selectively operate in the working mode of the electronic fuse or in the working mode of the interface fuse according to different usage requirements in the case when only one single integrated chip is provided, so as to enhance the usage convenience of the integral multifunction chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
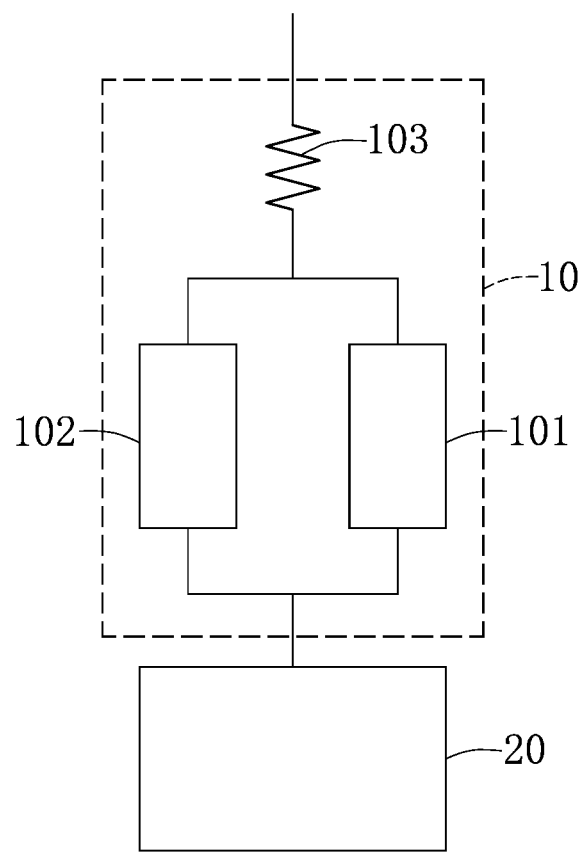
FIG. 1 is a functional block view of an integral multifunction chip in one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
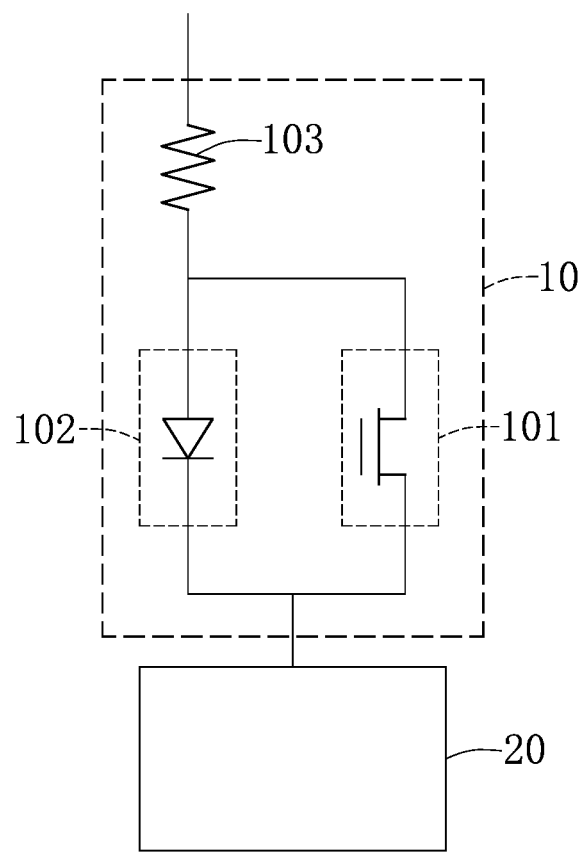
FIG. 2 is a circuit view of the integral multifunction chip in the embodiment of the present disclosure.

With reference to FIG. 1 and FIG. 2, FIG. 1 is a functional block view of an integral multifunction chip in one embodiment of the present disclosure and FIG. 2 is a circuit view of the integral multifunction chip in the embodiment of the present disclosure. The integral multifunction chip 10 provided in the embodiment of the present disclosure includes an electronic fuse 101 and an interface fuse 102. The interface fuse 102 is connected to the electronic fuse 101 in parallel, and the electronic fuse 101 and the interface fuse 102 are integrated within one signal chip.

Firstly, the electronic fuse 101 (electronic fuses, E-fuse) is a one-time programming non-volatile memory, and the principle of the electronic fuse 101 relates to a large current being transmitted to the electronic fuse 101, and the large current will damage the fuse so as to achieve a writing function. In general, the electronic fuse 101 can be programmed by the transmission of the large current. The large current can be used to break the structure of the electronic fuse 101 to form an open circuit. For the programming of a conventional electronic fuse, the electronic fuse structure to be programmed is usually selected by a decoding address, and the decoding address is generated by a control circuit powered by a low voltage power supply (V).

In addition, the advantage of the electronic fuse 101 is that the electronic fuse 101 can be directly fabricated in a Complementary Metal-Oxide-Semiconductor (CMOS) logic process, and can be read and written directly at a low voltage. The electronic fuse memory can be divided into a polycrystalline germanium fuse and a metal fuse simply by a main composition material. The polycrystalline germanium type of the memory of the electronic fuse mainly utilizes the material of the main constituents in the polysilicon gate in the CMOS logic process, and the current is mainly transmitted through the metal germanium layer for electromigration effect. Compared with metal-type electronic fuse memory, the biggest advantage of the polycrystalline germanium type of the memory of the electronic fuse is that the required operating current is small.

In addition, regarding the interface fuse 102 (I-fuse), the interface fuse 102 is composed of an interface between a contact and a metal or a contact and a polysilicon. The advantages of the interface fuse 102 are low power, low operating voltage, compatibility with general logic processes and having a smaller size than other fuse memory components. Moreover, because of the architecture of the interface fuse memory component, the interface fuse has a lower programming current than the electronic fuse.

Figure 3:
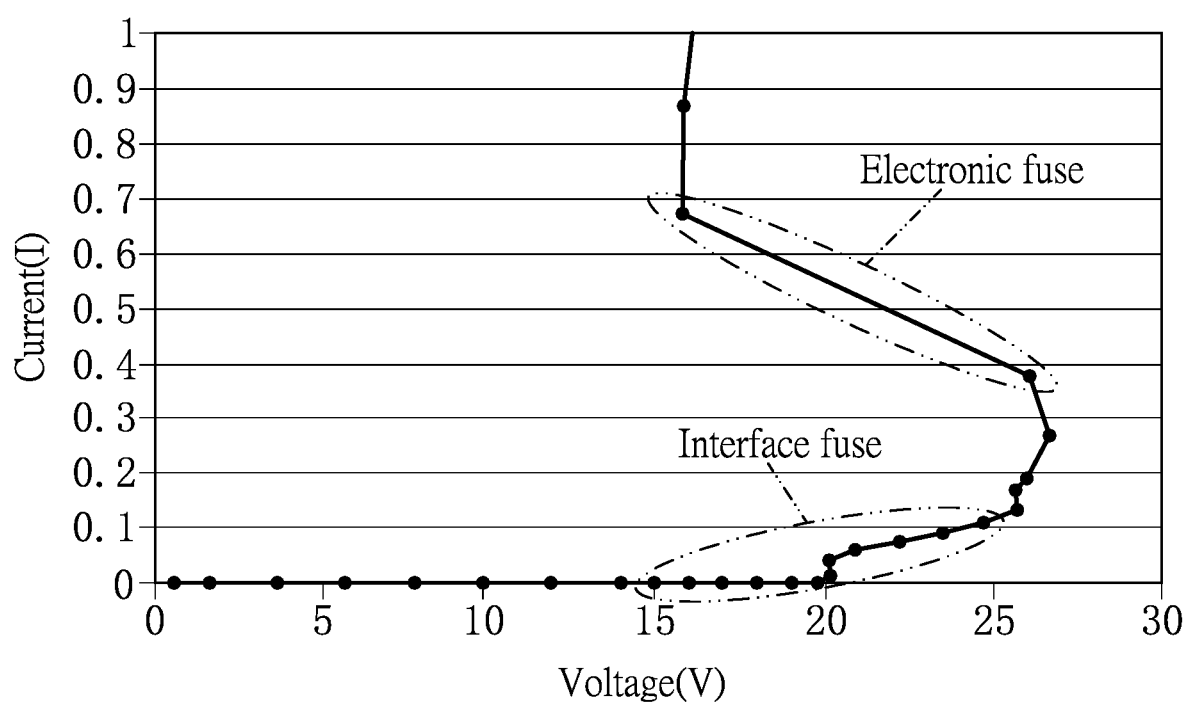
FIG. 3 is a curve diagram showing a relationship between voltage and current of an integral multifunction chip operating in a working mode of an electronic fuse or a working mode of an interface fuse in one embodiment of the present disclosure.

The following examples that are given are not intended to limit the present disclosure. When the input voltage of the electronic fuse 101 has exceeded a certain time, the power is increased and thermal energy is generated to blow the electronic fuse 101 and short the electronic fuse 101. In addition, when the input current and the input voltage of the interface fuse 102 (as shown in FIG. 3) are low current and low voltage, the interface fuse 102 will correspondingly include a high resistance; and when the input current and the input voltage of the interface fuse 102 are high current and high voltage, the interface fuse 102 will correspondingly include a low resistance.

Figure 4:
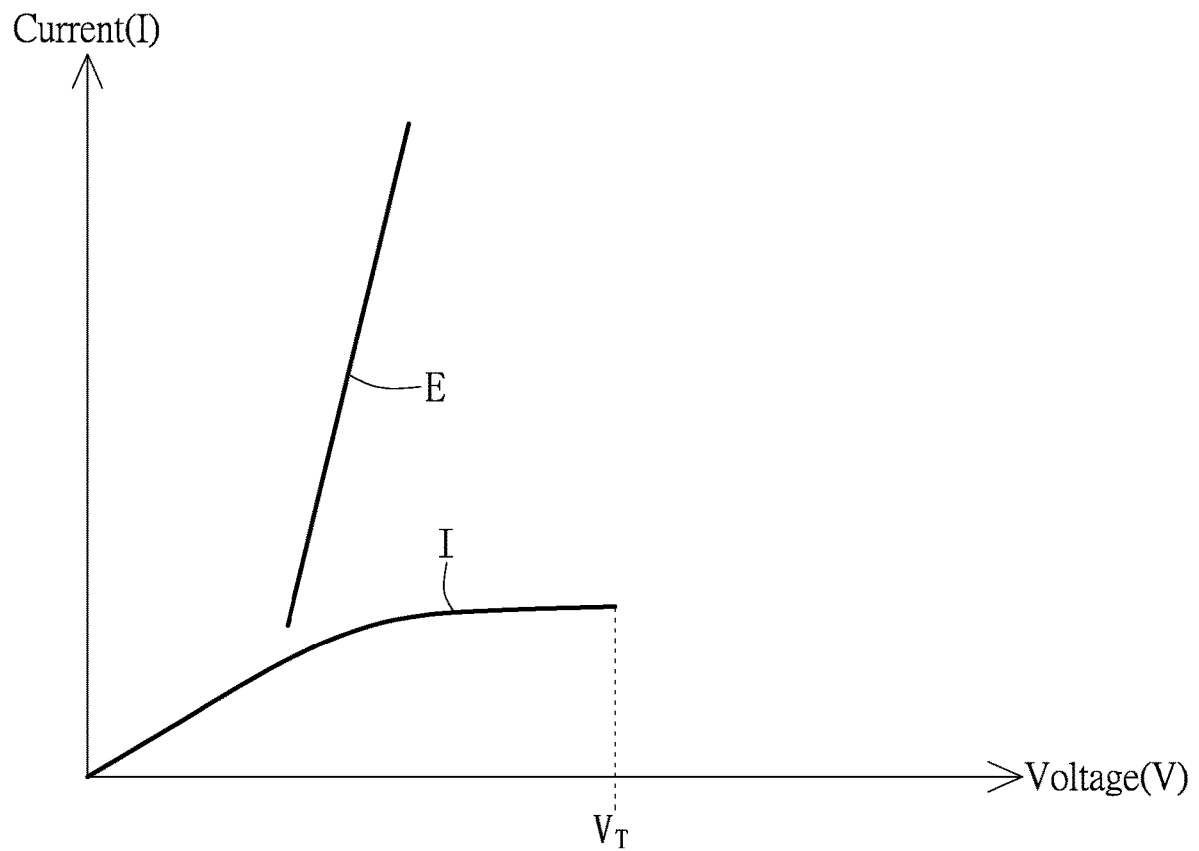
FIG. 4 is another curve diagram showing the relationship between voltage and current of an integral multifunction chip operating in a working mode of an electronic fuse or a working mode of an interface fuse in one embodiment of the present disclosure.
Figure 5:
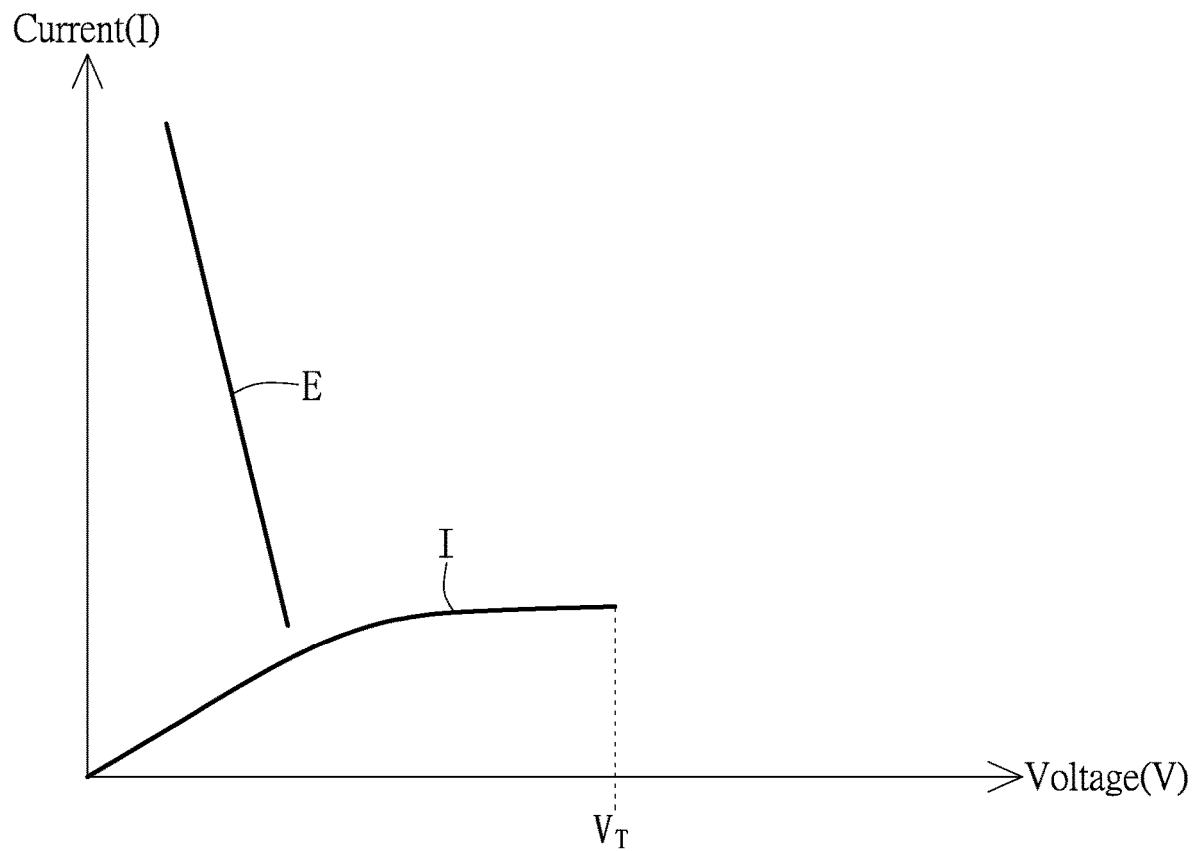
FIG. 5 is yet another curve diagram showing the relationship between voltage and current of an integral multifunction chip operating in a working mode of an electronic fuse or a working mode of an interface fuse in one embodiment of the present disclosure.

When the input current and the input voltage of the interface fuse 102 (as shown in FIG. 4 and FIG. 5) are low current and low voltage, the interface fuse 102 will correspondingly include a low resistance; and when the input current and the input voltage of the interface fuse 102 are high current and high voltage, the interface fuse 102 will correspondingly include a low resistance. Since the electronic fuse 101 and the interface fuse 102 have their respective operating voltage ranges, in the integral multifunction chip 10 of the present disclosure, when the voltage input to the integral multifunction chip 10 is less than a threshold voltage, the integral multifunction chip 10 will operate in the working mode of the interface fuse 102. When the input current and the input voltage of the interface fuse 102 are low current and low voltage or high current and high voltage, the interface fuse 102 correspondingly includes a low resistance or a high resistance to change the logic state of the integral multifunction chip 10 (as shown in FIG. 4 and FIG. 5). When the input current and the input voltage of the interface fuse 102 (shown in FIG. 3) are low current and low voltage, the interface fuse 102 will correspondingly include a high resistance; and when the input current and the input voltage of the interface fuse 102 are high current and high voltage, the interface fuse 102 will correspondingly include a low resistance.

In addition, when the voltage input to the integral multifunction chip 10 is greater than the threshold voltage, the integral multifunction chip 10 will operate in the working mode of the electronic fuse 101, and when the input voltage of the electronic fuse 101 has exceeded a period of time, the high temperature is generated and the electronic fuse 101 is blown. Accordingly, through the integral multifunction chip 10 of the present disclosure, the user can control the input voltage of the integral multifunction chip 10 to operate the integral multifunction chip 10 in the working mode of the electronic fuse 101 or the working mode of the interface fuse. 102.

Furthermore, the integral multifunction chip 10 in the present disclosure further includes a variable resistor 103, and the variable resistor 103 is connected to the electronic fuse 101 and the interface fuse 102 in series, respectively. The variable resistor 103 is disposed on the integral multifunction chip 10 to control the input voltage of the integral multifunction chip 10, thereby controlling the integral multifunction chip 10 to operate in the working mode of the electronic fuse 101 or in the working mode of the interface fuse 102.

Further, the logic state of the integral multifunction chip 10 in the present disclosure is changed according to whether the electronic fuse 101 or the interface fuse 102 is blown or not. For example, when the electronic fuse 101 or the interface fuse 102 is not blown, the logic state of the integral multifunction chip 10 is 1, and when the electronic fuse 101 or the interface fuse 102 is blown, the logic state of the integral multifunction chip 10 is 0. Alternatively, the logic state of the integral multifunction chip 10 is 0 when the electronic fuse 101 or the interface fuse 102 is not blown. And the logic state of the integral multifunction chip 10 is 1 when the electronic fuse 101 or the interface fuse 102 is cut off. However, the disclosure is not limited to the examples set forth above.

In addition, in the application of the integral multifunction chip 10 of the present disclosure, the integral multifunction chip 10 can be installed in a control circuit 20, as shown in FIG. 1.

The control circuit 20 selectively operates in a first mode or a second mode in accordance with the logic state of the integral multifunction chip 10. For example, the first mode of the control circuit 20 may be a reading mode and the second mode may be a writing mode, but is not limited thereto. In addition, the integral multifunction chip 10 having the electronic fuse 101, the variable resistor 103 and the interface fuse 102 can be integrated in one single chip during the manufacturing process. However, the disclosure is not limited to the examples set forth above.

FIG. 3 is a curve diagram of voltage versus current when the integral multifunction chip operates in a working mode of the electronic fuse or the working mode of the interface fuse in the embodiment of the present disclosure. As shown in FIG. 3, FIG. 4 or FIG. 5, when the input current of the interface fuse 102 is 0 and the input voltage is between 14V and 20V, which is low current and low voltage, the interface fuse 102 will include a low resistance. When the input current of the interface fuse 102 is between 0A and 0.1A, and the input voltage is about 20V-25V, which is high current and high voltage, the interface fuse 102 will include a high resistance. The integral multifunction chip in the present disclosure will produce a snapback and then operate in a large current range (>1A) when the current is between approximately 0.4A and 0.68A and the voltage is approximately 16-25V, and the integral multifunction chip in the present disclosure operates in the working mode of the electronic fuse.

In addition, as shown in FIG. 4, when the voltage input to the integral multifunction chip 10 is lower than a threshold voltage (VT), the integral multifunction chip 10 operates in the working mode of the interface fuse 102. When the voltage and the current are low, the interface fuse 102 will correspondingly include a low resistance. When the voltage and the current are high, the interface fuse 102 will correspondingly include high resistance. The aforementioned numerical ranges are used for exemplification purposes only and are not intended to limit the scope of the present disclosure, and in practical application, the numerical ranges or values can be defined according to different properties of different products. A working range of the integral multifunction chip 10 of the present disclosure is in a large current interval (>1A) when the integral multifunction chip 10 generates snapback at the voltage between 14V and 25V and the current between 0A and 0.68A. Therefore, there is a larger operable range in the present disclosure compared to an integrated circuit using only an electronic fuse or an interface fuse. As shown in FIG. 4, the slope of the electronic fuse 101 is positively correlated, but in a different embodiment, the slope of the electronic fuse 101 may also be negatively correlated, as shown in FIG. 5, and is not limited thereto.

As described above, the logic determination (0 or 1) of the interface fuse 102 is that the low voltage/low current corresponds to the low resistance and the high voltage/high current corresponds to the high resistance, so that there is an advantage that the chip is programmable. When the input voltage exceeds the threshold voltage (VT), the electronic fuse 101 generates high heat and the electronic fuse 101 is blown. The integral multifunction chip in the present disclosure is capable of controlling the input voltage in the integral multifunction chip by adjusting the resistance of the variable resistor so as to enable the integral multifunction chip 10 to operate in the working mode of the interface fuse 102 (within the wire working range I of the interface fuse, the trajectory curve formed by the relationship between voltage and current, as shown in FIG. 4 or FIG. 5) or in the working mode of the electronic fuse 101 (within the working range E of the electronic fuse, and the trajectory curve formed by the relationship between the voltage and the current shown in FIG. 4 or FIG. 5).

The advantages in the present disclosure are that the integral multifunctional chip 10 provided in the present disclosure can selectively operate in the working mode of the electronic fuse 101 or in the working mode of the interface fuse 102 according to different usage requirements in the case where only one single integral chip is provided, so as to enhance the usage convenience of the integral multifunction chip 10.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An integral multifunction chip, comprising:
   an electronic fuse; and
   an interface fuse connected to the electronic fuse in parallel;
   wherein a relationship between a voltage and a current is positively or negatively correlated when the integral multifunction chip is operated in a working mode of the electronic fuse;
   wherein, when the integral multifunction chip generates a snapback at a voltage between 14V and 25V and a current between 0A and 0.68A, a working range of the integral multifunction chip is in a large current interval greater than 1A;
   wherein, when an input current of the interface fuse is 0, and an input voltage of the interface fuse is between 14V and 20V, the interface fuse provides a low resistance;
   wherein, when the input current of the interface fuse is between 0A and 0.1A, and the input voltage of the interface fuse is about 20V-25V, the interface fuse provides a high resistance greater than the low resistance.

2. The integral multifunction chip according to claim 1, wherein the interface fuse has the low resistance when the voltage and the current inputted to the interface fuse are low.

3. The integral multifunction chip according to claim 1, further comprising a variable resistor connected in series to each of the electronic fuse and the interface fuse, and the electronic fuse, the interface fuse and the variable resistor are integrated within a same signal chip; wherein the variable resistor is configured to control an input voltage of the integral multifunction chip.

4. The integral multifunction chip according to claim 1, wherein the electronic fuse is a one-time programming non-volatile memory, and the current is transmitted to the electronic fuse so as to damage the electronic fuse.

* * * * *